(12) United States Patent
Hsu et al.

(10) Patent No.: US 6,939,726 B2
(45) Date of Patent: Sep. 6, 2005

(54) VIA ARRAY MONITOR AND METHOD OF MONITORING INDUCED ELECTRICAL CHARGING

(75) Inventors: Yung-Lung Hsu, Tainan (TW); James Wu, Kao-Shiung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 99 days.

(21) Appl. No.: 10/634,005

(22) Filed: Aug. 4, 2003

(65) Prior Publication Data

US 2005/0032253 A1 Feb. 10, 2005

(51) Int. Cl.[7] .................... H01L 21/66; H01L 21/4763; G01R 31/26
(52) U.S. Cl. .................... 438/14; 438/17; 438/622; 438/926
(58) Field of Search .................... 438/14, 17, 622, 438/926

(56) References Cited

U.S. PATENT DOCUMENTS

| | | | | |
|---|---|---|---|---|
| 5,315,145 A | * | 5/1994 | Lukaszek | 257/379 |
| 5,844,300 A | * | 12/1998 | Alavi et al. | 257/532 |
| 6,300,756 B2 | * | 10/2001 | Sturm et al. | 324/109 |
| 6,771,092 B1 | * | 8/2004 | Fung et al. | 324/765 |
| 2001/0011887 A1 | * | 8/2001 | Sturm et al. | 324/109 |
| 2002/0130260 A1 | * | 9/2002 | McCord et al. | 250/306 |
| 2003/0216047 A1 | * | 11/2003 | Hu et al. | 438/692 |
| 2004/0115943 A1 | * | 6/2004 | Yao et al. | 438/692 |
| 2005/0032253 A1 | * | 2/2005 | Hsu et al. | 438/17 |

* cited by examiner

Primary Examiner—David E. Graybill
(74) Attorney, Agent, or Firm—Tung & Associates

(57) ABSTRACT

An electrical monitor comprising a via array and method for determining and reducing an electrically charged state of a semiconductor process wafer the method including providing a metal filled via array including a plurality of interspersed electrically isolated dummy metal portions to form a via array monitor; exposing the semiconductor process wafer including the via array monitor to an electrical charge altering process including to produce an electrically charged state over at least a portion of the semiconductor wafer; carrying out electrical measurements of the via array monitor to determine a level of the electrically charged state; and, carrying out an electrically charge neutralizing process to reduce a level of the electrically charged state to a predetermined acceptable level prior to carrying out a subsequent process.

24 Claims, 2 Drawing Sheets

VIA ARRAY MONITOR AND METHOD OF MONITORING INDUCED ELECTRICAL CHARGING

FIELD OF THE INVENTION

This invention generally relates to micro-integrated circuit processing methods including and more particularly to wafer manufacturing process induced electrical charging such as plasma induced charging and an electrical monitoring structure and method to determine electrical properties including an electrical charge state of the process wafer to reduce or avoid circuitry defects including galvanic corrosion of tungsten plugs to improve device reliability and performance.

BACKGROUND OF THE INVENTION

Metallization interconnects are critical to the proper electronic function of semiconductor devices. Several advances in semiconductor processing have been aimed at improving signal transport speed by reducing metal interconnect resistivities and improving electromigration resistance. Copper has increasingly found application for use as metal interconnects in upper levels of a multi-level device due to its low resistivity and higher resistance to electromigration. However, AlCu metal interconnects used in lower levels of the semiconductor device, for example to provide electrical metal interconnects, is still preferred for a variety of reasons. Among the reason for continued use of AlCu metal interconnects in lower metallization levels is the compatibility of aluminum with silicon including forming superior contacts with lower susceptibility to corrosion. Further, AlCu is readily etched by reactive ion etching (RIE) to form metal interconnects, for example, in the formation of bit lines for a DRAM portion of embedded memory in a logic circuit. In addition, the use of pure copper in lower metallization levels creates the potential of diffusion of copper through dielectric insulating layers and poisoning of doped silicon well areas in transistors by creating deep impurity levels and contributing to junction leakage.

As design rule technology progresses below 0.25 microns, also referred to as sub-quarter micron technology, the ability to achieve complete overlap of metal interconnect lines and underlying metal filled vias is increasingly problematical. Typically, complete overlap is not generally achievable, causing the underlying metal filled via to be partially exposed after forming the overlying metal lines, for example AlCu metal lines formed by a metal etch process.

Tungsten is generally preferred for use in filling vias, also referred to as plugs, in lower levels of a multi-layer semiconductor structures for various reasons including the fact that it provides an effective diffusion barrier to metal diffusion from overlying metallization layers to react with the silicon substrate. Tungsten further has high resistance to electromigration and can effectively be used to fill high aspect ratio vias by chemical vapor deposition (CVD) processes.

One problem with etching overlying metal layers, for example AlCu, in a reactive ion etch (RIE) process is the exposure of a portion of the underlying tungsten plugs. During the metal etching process the plasma process can induce charge imbalance on the wafer surface including a positive charge on the exposed tungsten plug portions. During a subsequent wet stripping process to remove residual photoresist following the etching process, a galvanic reaction of hydroxyl ions with the positively charge tungsten may take place causing the formation of tungsten oxide, e.g., $WO_2$, which has the effect of increasing electrical resistance in addition to causing dissolution and erosion (corrosion) of portions of the tungsten plug. For example, see "A New Failure Mechanism by Corrosion of Tungsten in a Tungsten Plug Process" by S. Bothra et al., Technology Department, VLSI Technology Inc. (1998). As a result, electrical open circuits are formed, creating defective circuitry.

Various approaches have been proposed to reduce the corrosion of tungsten plugs including passivating the exposed tungsten portions with a low pH solution, such as nitric acid, or by using an electron beam to discharge the charged metal plug portions prior to the wet stripping process. Such approaches, however, have not always been effective and may incur undesirable additional operating costs.

While various approaches may be carried out at the end of an RIE etching or ashing process to electrically discharge charged portions of the process wafer, according to prior art processes there has not been used an in-line quantitative process to determine the extent of discharge with respect to selected portions of the wafer. As a result, either portions of the wafer will remain charged or the plasma discharging process is carried out to an excessive extent, reducing wafer throughput Therefore, there is a need in the semiconductor integrated circuit manufacturing art to develop an electrical monitoring structure and in-line electrical property measurement process to determine an electrical charge state of the process wafer to reduce or avoid circuitry defects including corrosion of tungsten plugs to improve device performance and reliability.

It is therefore an object of the invention to provide an electrical monitoring structure and in-line electrical property measurement process to determine an electrical charge state of the process wafer to reduce or avoid circuitry defects including corrosion of tungsten plugs to improve device performance and reliability, while overcoming other shortcomings of the prior art.

SUMMARY OF THE INVENTION

To achieve the foregoing and other objects, and in accordance with the purposes of the present invention, as embodied and broadly described herein, the present invention provides a via array monitor and method for determining and reducing an electrically charged state of a semiconductor process wafer.

In a first embodiment, the method includes providing a metal filled via array in at least one level of multi-level device comprising a semiconductor process wafer the metal filled via array in electrical communication with at least one underlying metallization layer the metal filled via array further including a plurality of interspersed electrically isolated dummy metal portions to form a via array monitor; exposing the semiconductor process wafer including the via array monitor to an electrical charge altering process including to produce an electrically charged state over at least a portion of the semiconductor wafer; carrying out electrical measurements of the via array monitor to determine a level of the electrically charged state; and, carrying out an electrically charge neutralizing process to reduce a level of the electrically charged state to a predetermined acceptable level prior to carrying out a subsequent process.

These and other embodiments, aspects and features of the invention will be better understood from a detailed descrip-

DETAILED DESCRIPTION OF THE PREFERRED EMBODIMENTS

Although the method and via array electrical monitor of the present invention is explained by reference to parallel formation of tungsten plugs (vias) with an overlying AlCu metal interconnect structure, it will be appreciated that the via array monitor may be formed of any metal in parallel with an micro-integrated circuit manufacturing process to advantageously monitor the electrical properties including an electrical charge state of a substrate following any charge imbalance producing manufacturing process. For example, charge imbalance producing manufacturing process may include plasma enhanced treatments such as reactive ion etch (RIE) processes, CMP treatments, as well as exposure to electrical charge producing (e.g., UV) light environments. In accordance with the exemplary embodiment of the invention, it is noted that the via array monitors are particularly advantageously used in monitoring an electrical charge state of the wafer process surface where tungsten vias are present to prevent subsequent erosion or corrosion by galvanic chemical reaction of exposed tungsten portions in a photoresist stripping process.

Figure 1:
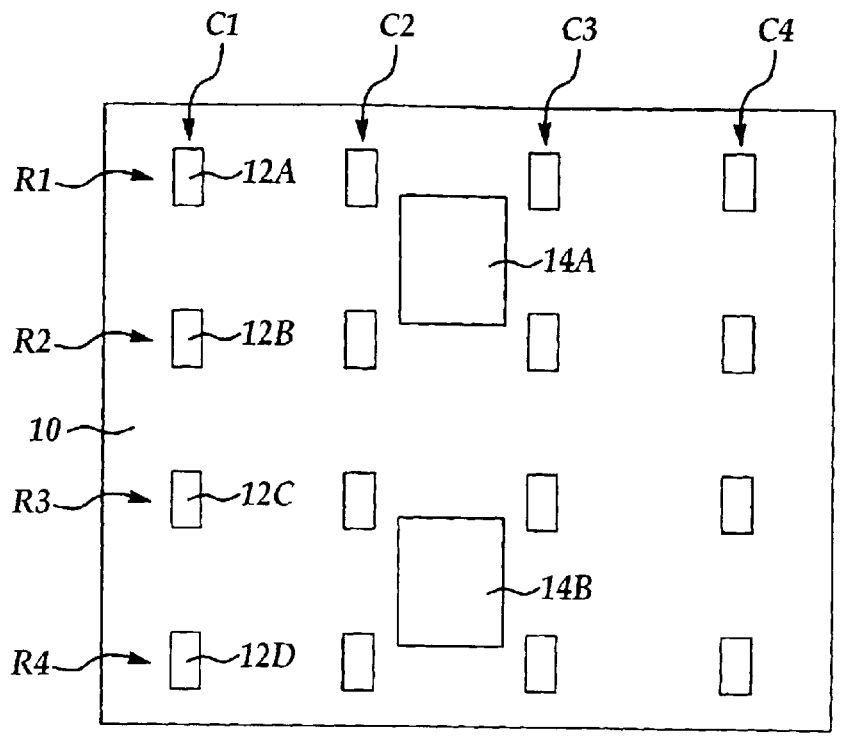
FIG. 1 is a top planar view of a portion an exemplary via array monitor including floating dummy vias providing an electrical monitoring means for an in-line wafer electrical test (WET) according to an embodiment of the invention.

Referring to FIG. 1, is shown a top planar view of a die portion including an exemplary array of metal filled vias, also referred hereafter as a via array monitor. For example, tungsten vias, e.g., 12A, 12B, 12C, 12D, are formed in dielectric insulating layer 10 and arranged in an array of rows e.g., R1, R2, R3, R4, and columns e.g., C1, C2, C3, C4. Electrically isolated dummy metal portions e.g., 14A and 14B, are shown interspersed between the vias, for example, between columns of the via array, e.g., between C2 and C3. Although the via array monitor need not be necessarily formed into an array of rows and columns, but may be a regularly repeating pattern of vias in 2 dimensions, a row and column configuration is generally preferred due to ease of design of photolithographic masks and interspersing electrically isolated dummy metal portions at a predetermined density. Preferably, the via array monitor area is rectangularly shaped having a dimension of from about 1 to about 8 microns on a side.

As shown in FIG. 1, there is a density of about 2 dummy metal portions for about 16 vias. For example, preferably there is provided an interspersed column of electrically isolated dummy metal portions e.g., 14A and 14B, from about every 3 to about every 8 columns (or rows) of vias. For example, preferably, the dummy metal portions are disposed such that each dummy metal portion is about equally spaced (equidistant) from adjacent vias. The size of the via array monitor may vary, but is preferably a predetermined size with a predetermined density of vias having interspersed metal dummy portions provided at a predetermined density. For example the spacing between adjacent vias may be from about 2 to about 10 via diameters. For example, about 5 to about 25 dummy metal portions are provided for about every 80 to 100 vias. It will be appreciated that the density of vias in the via array including dummy metal portions may vary depending on the metal used to form the metal dummy portions, and the degree of electrical charging produced in an electrical charge producing process. For example, a higher density of dummy metal portions in the via array may be expected to provide a greater electrical measurement sensitivity to changes in electrical measurements indicating an electrical charge state of the process wafer. For example, the electrically isolated dummy vias act as point charge accumulating features which can measurably affect a resistance measurement of the vias allowing an inference of the electrical charge state of the via array and the respective wafer die. In one embodiment, the exposed surface areas of the dummy metal portions in the horizontal plane of the process wafer have a planar surface area from about 1 to about 8 times the planar surface area of the via structures. It will be appreciated that the smaller the dummy metal portions, the more dummy metal portions will be required to produce the desired point charging effect in response to a wafer process producing a charge imbalance, for example a plasma enhanced etching or ashing process.

The electrical properties of the via array monitor, including resistance, impedance, or electrical charge, preferably at least a via array resistance, may be measured by any conventional wafer electric testing (WET) apparatus including, for example automated micro-manipulator probes preferably where individual wafer die are tested and where the results for individual die are archived for later production of a contour or die map of the wafer surface. For example, a voltage or current is applied by a probe array to predetermined contact areas on the wafer surface to electrically test the via array monitors. It will be appreciated that non-contact methods may be used as well, for example including an AC signal for producing eddy currents in the metal filled portions exposed at the wafer surface.

According to the present invention it has been found that electrical measurements including at least one of resistance, impedance, and electrical charge measurements of the via array are altered according to a charge imbalance state existing on the wafer surface where electrically isolated floating dummy metal portions are interspersed in the via array monitor according to preferred embodiments. For example, the measured resistance, impedance or electrical charge measurements will result in an abnormally relatively higher values for the via array when an electrical charge imbalance is present on the semiconductor wafer surface compared to electrical measurement values obtained when charge imbalances on the wafer surface are within a predetermined acceptable range.

For example, a process wafer including individual die having via arrays with interspersed dummy metal portions according to preferred embodiments is electrically measured, for example according to a WET method using microprobes to pass one of a current or voltage through at least portions of the via arrays following an electrical charge altering process, for example a plasma enhanced process or a wafer dechucking process from an electrostatic chuck. Electrical measurement results are determined which correspond to one of an acceptable or unacceptable state including a charge imbalance state following a charge altering wafer process. A calibration process to determine acceptable electrical measurement results of a particular configuration of a via array monitor is preferably carried out to determine electrical measurement values including those corresponding to an acceptable electrical charge state and an unacceptable electrical charge state of an individual wafer die.

For example, a charge imbalance reducing plasma treatment is carried out following an electrical charge imbalance producing process, for example an RIE or plasma ashing treatment, to at least partially neutralize (reduce) the electrical charge imbalance over portions of the wafer. Preferably the via array monitor and subsequent electrical measurement results are previously calibrated, for example producing a range of charge imbalance states which are then electrically measured and verified by a separate charge state measurement process. For example, charge imbalance reducing plasma treatments may be carried out over a range of times or plasma conditions to produce a range of electrically charged states for subsequent electrical measurement calibration purposes. In an exemplary calibration process, for example, a selected applied RF power, and frequency may be selected and carried out for predetermined time periods to produce a range of electrical charge imbalance states of the wafer surface prior to transfer to the next process. A WET electrical measurement process, preferably at least measuring the via array resistance, is then carried out to determine an acceptable result window including a range of acceptable electrical measurement values which correspond to an acceptable electrical charge imbalance state of the wafer and an unacceptable result window including a predetermined alarm level indicating an unacceptable electrical charge imbalance state of the wafer.

Following calibration, in operation, following an electrical charge altering wafer process, when electrical measurement values falling within an unacceptable result window are obtained, a subsequent electrical charge reducing wafer process is carried out and electrical measurement of the via array monitor repeated to produce electrical measurement results within an acceptable result window prior to carrying out a subsequent process.

Referring to FIGS. 2A–2D, in an exemplary embodiment of the method of the present invention, cross sectional views of wafer portion A and wafer portion B, separated in space on a semiconductor process wafer, are shown at parallel stages in a micro-integrated circuit manufacturing process. Portion A represents the active portion of a wafer die and portion B represents a via array monitor portion of the die formed according to preferred embodiments for electrical monitoring including measuring at least one of resistance, impedance (e.g., real and imaginary parts), and an electrical charge.

Figure 2A:
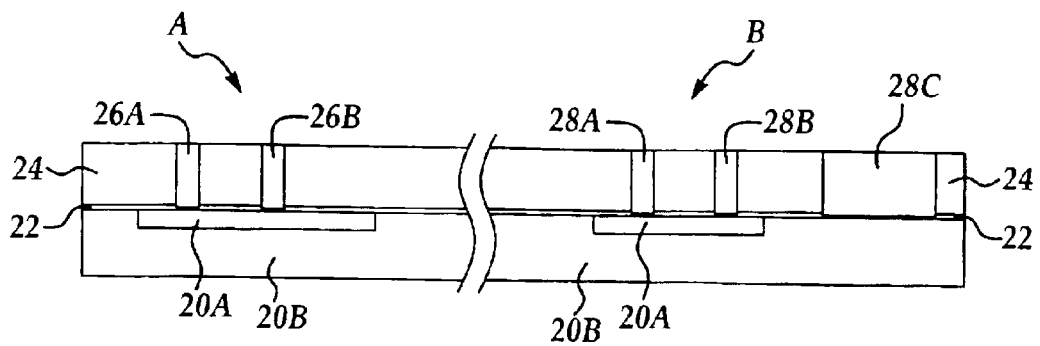
FIGS. 2A–2D are cross sectional representations of active and via array monitor portions of a multi-level semiconductor device at parallel stages of manufacture according to an embodiment of the present invention.

For example, referring to FIG. 2A, a first metal layer 20A, for example a contact layer formed of an aluminum:copper (AlCu) alloy is formed in dielectric insulating layer 20B by conventional methods. A first barrier layer 22, for example a Ti/TiN layer, is provided over the metal layer 20A. Overlying the first barrier layer 22 is formed a pre-metal dielectric (PMD) layer 24, formed of, for example TEOS (tetra-ethyl-ortho-silicate) silicon dioxide, and optionally including a dopant such as fluorine or carbon to lower the dielectric constant. Following a conventional photolithographic patterning and anisotropic etching process, tungsten filled plugs e.g., 26A, 26B shown in active device wafer portion A and via array plugs (vias) e.g., 28A, 28B shown in wafer portion B, forming a portion of the via array monitor are formed by first anisotropically etching the respective plug openings in the PMD 24 to form closed communication with the underlying metal layer 20A. Dummy metal portion e.g., 28C is formed to be electrically isolated (floating), i.e., without making contact with an underlying metal layer e.g., 20A. The respective plug openings including the dummy metal portion may be lined with a second barrier layer e.g., Ti/TiN (not shown) prior to depositing a tungsten (W) metal layer by a conventional CVD process, to fill the respective openings. A dry etchback process or a chemical mechanical polish (CMP) is then carried out to planarize the process surface to remove excess tungsten forming tungsten filled openings e.g., active tungsten plugs 26A, 26B, via array monitor plugs 28A, 28B, and dummy metal portion, 28C.

Figure 2B:
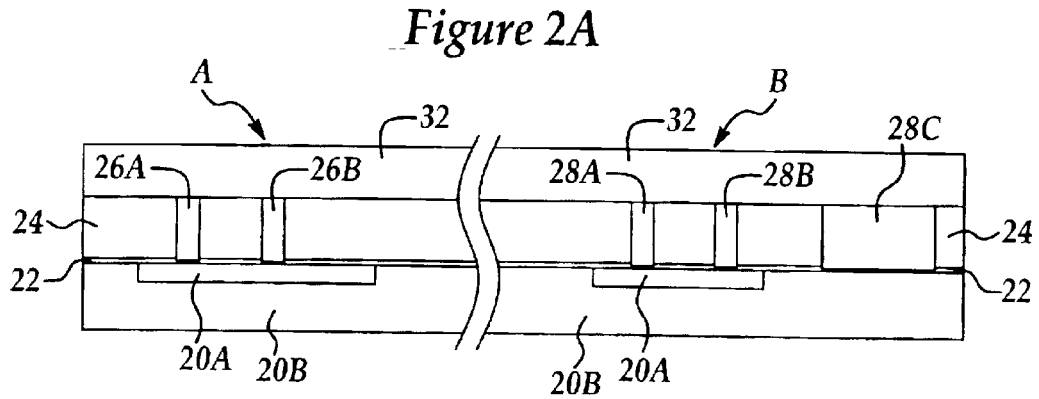
Figure 2C:
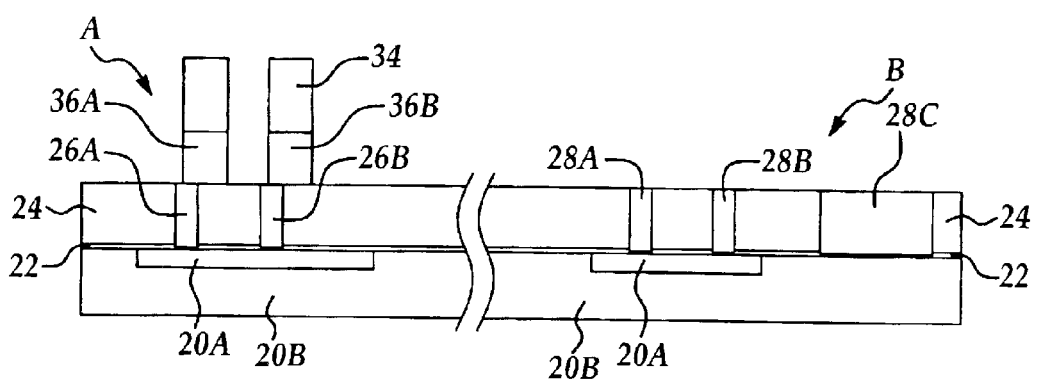
Figure 2D:
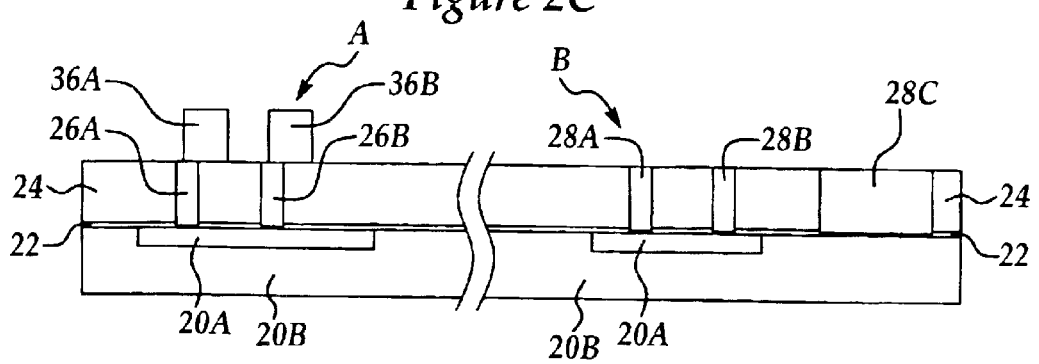

Referring to FIG. 2B, a layer 32 of AlCu, for example, an AlCu alloy having from about 0.5 wt % to about 4 wt % of copper is blanket deposited over the process surface including wafer portions A and B by conventional PVD sputtering methods, for example to a thickness of from about 1500 to about 5000 Angstroms. An anti-reflectance coating (ARC) (not shown), for example TiN, may be deposited over the AlCu layer to reduce light reflections prior to a subsequent photolithographic patterning process.

Referring to FIG. 1C, a photoresist layer 34 is deposited and photolithographically patterned to produce an RIE etching pattern for forming metal interconnect lines over wafer portion A, followed by a conventional RIE etching process to etch away portions of the AlCu layer 32 to leave metal interconnect lines e.g., 36A and 36B overlying the tungsten plugs e.g., 26A and 26B, in wafer portion A including at least partially exposing the tungsten plugs 28A, 28B, and 28C forming a portion of the via array monitor in wafer portion B. It will be appreciated that the metal lines e.g., 36A and 36B may be formed without fully covering the underlying tungsten plugs 26A and 26B, thereby revealing a portion of the tungsten plugs in wafer portion A following the RIE etching process.

Referring to FIG. 1D, following the RIE etching process to form the metal interconnect lines e.g., 36A and 36B and at least partially exposing the via array monitor portion a conventional plasma etching process including oxygen as a source gas is carried out to at least partially remove the photoresist layer. It will be appreciated that residual polymer materials will remain over a portion of the wafer surface including sidewall portions of the metal interconnect lines e.g., 36A and 36B which will require a subsequent wet stripping process to fully remove photoresist and residual polymeric materials from the wafer surface. It will be appreciated that the RIE process and ashing process may be carried out in separate etching chambers, for example in a cluster tool without exposure to atmosphere. Following at least the ashing process, preferably, a charge neutralizing (reducing) treatment is carried out to at least partially neutralize electrical charge imbalances introduced during the RIE and ashing processes. The charge neutralizing treatment may include plasma treatments with inert or other gases, following at least the ashing process, and optionally following the RIE etching process. The charge neutralizing treatment may alternatively or additionally include applying a voltage or current to the wafer to at least partially neutralize the charged wafer in a dechucking process used for removing a wafer from an electrostatic chuck as is known in the art.

Following one or more charge neutralization treatments, the process wafer is transferred to a WET station for carrying out electrical measurements of the via array monitor portion including interspersed electrically isolated dummy metal portions according to preferred embodiments. The via array monitor portions are electrically tested preferably in each individual wafer die including measuring at least one of a resistance, impedance and electrical charge, more preferably at least a resistance, of the via array monitor portion. It will be appreciated that less than the entire number of wafer die may be tested, but preferably all are tested.

Following electrical measurement of the via array monitor portions of the individual die, preferably a contour map is created with the measurement results for individual die to determine which die and the number of die exhibiting electrical measurement values outside a predetermined acceptable result window indicating an unacceptable electrical charge state of the wafer die. For example, if more than a predetermined number of wafer die indicate electrical measurement values outside a predetermined acceptable result window, a decision is optionally be made to repeat one or more of the charge neutralizing treatments followed by re-measurement of the via array monitor until a predetermined number of die show measurement results within an acceptably predetermined measurement result window.

Following achievement of a predetermined number of die showing measurement results within an acceptably predetermined measurement result window, a subsequent process, for example, a wet stripping process is then carried out to remove residual polymer material from the wafer surface, for example using a conventional wet stripper including hydroxyl groups, for example ACT or EKC.

Following the wet stripping process, the wafer is rinsed and returned to the WET station to carry out a second set of via array monitor electrical measurements including at least one of resistance, impedance, and electrical charge measurements to check for circuit integrity including open circuits. For example, in the exemplary embodiment, it has been found that carrying out electrical testing of the via array monitor according to preferred embodiments prior to a wet stripping process allows a determination of whether an excessive electrical charge state of the wafer is present. Advantageously, the process allows additional charge neutralizing processes to be undertaken prior to the wet stripping process which has been found to cause galvanic corrosion to electrically charged tungsten portions. Advantageously, the via array monitor allows electrical testing both prior to and following the wet stripping process to avoid circuitry defects. Further, the dummy metal portions advantageously act as point charge accumulators during the charge producing or charge neutralizing process thereby providing an known and calibrated electrical charge indicator with respect to the via array monitor electrical measurements. Following implementation of preferred embodiments of the invention it has been found that wafer yield is improved at least about 10 percent.

Figure 3:
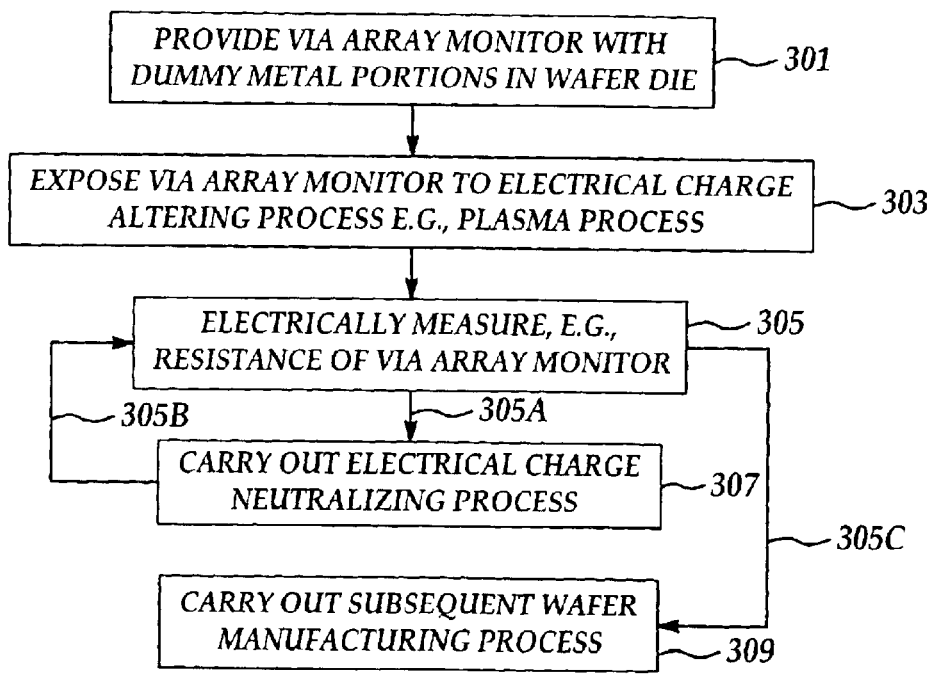
FIG. 3 is a process flow diagram including several embodiments of the present invention.

Referring to FIG. 3 is a process flow diagram including several embodiments of the present invention. In process 301 a via array monitor including electrically isolated dummy metal portions is provided in individual wafer die according to preferred embodiments. In process 303, an electrical charge altering wafer manufacturing process is carried out including exposure of the via array monitor to the electrical charge altering process, for example a plasma process or wafer dechucking process. In process 305, the via array monitor is electrically measured, e.g., an electrical resistance to determine whether electrically acceptable measurement values indicative of an acceptable electrical charge state of the wafer die are present. As indicated by directional process arrow 305A, an electrical charge neutralizing (reducing) process is carried out in process 307 if unacceptable electrical measurement values are determined in process 305. As indicated by process direction arrow 305B, electrical measurement process 305 is repeated following the charge neutralizing process. As indicated by directional process arrow 305C, a subsequent manufacturing process 309 is carried out if acceptable electrical measurement values indicative of an acceptable electrical charge state of the wafer die are present.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for determining and reducing an electrically charged state of a semiconductor process wafer comprising the steps of:
   providing a metal filled via array in at least one level of multi-level device comprising a semiconductor process wafer the metal filled via array in electrical communication with at least one underlying metallization layer the metal filled via array further including a plurality of interspersed electrically isolated dummy metal portions to form a via array monitor;
   exposing the semiconductor process wafer including the via array monitor to an electrical charge altering process including to produce an electrically charged state over at least a portion of the semiconductor wafer;
   carrying out electrical measurements of the via array monitor to determine a level of the electrically charged state; and,
   carrying out an electrically charge neutralizing process to reduce a level of the electrically charged state to a predetermined acceptable level prior to carrying out a subsequent process.

2. The method of claim 1, wherein the via array monitor is formed with a predetermined density of metal filled vias and electrically isolated dummy metal portions.

3. The method of claim 2, wherein the metal filled vias are formed in a rectangular shaped array comprising rows and columns of the metal filled vias.

4. The method of claim 3, wherein the dummy metal portions are interspersed periodically between one of the rows and the columns about equidistant from adjacent metal filled vias.

5. The method of claim 1, wherein the electrical charge altering process is selected from the group consisting of plasma-enhanced processes, chemical mechanical processes, and ultra-violet light exposure.

6. The method of claim 1, wherein the electrical charge altering process is selected from the group consisting of a reactive ion etch (RIE) process, an ashing process, a plasma treatment process, and an electrostatic dechucking process.

7. The method of claim 1, wherein the metal for forming the metal filled vias and the electrically isolated dummy metal portions is selected from the group consisting of copper, aluminum, tungsten, and alloys thereof.

8. The method of claim 1, wherein the via array monitor is provided within a plurality of wafer die comprising the semiconductor process wafer.

9. The method of claim 1, wherein the via array monitor is at least partially exposed in a level immediately underlying a metallization level following a plasma enhanced metal etching process.

10. The method of claim 9, wherein the level underlying a metallization level comprises tungsten plugs and the metallization level comprises AlCu metal interconnect lines.

11. The method of claim 10, wherein the subsequent process comprises a wet stripping process comprising hydroxyl ions.

12. The method of claim 1, wherein the charge neutralizing process comprises a plasma treatment with one of argon, helium, nitrogen, and hydrogen.

13. The method of claim 1, wherein the charge neutralizing process comprises applying one of a current and voltage to at least portions of the semiconductor process wafer.

14. The method of claim 1, wherein the steps of carrying out electrical measurements and carrying out an electrically charge neutralizing process are sequentially repeated to achieve the predetermined acceptable level.

15. The method of claim 1, wherein the step of carrying out electrical measurements is selected from the group of measurements consisting of resistance, impedance, and electrical charge.

16. A method for monitoring electrical properties in a micro-integrated circuit manufacturing process comprising the steps of:

providing a metal filled via array in at least one level of multi-level device comprising a semiconductor process wafer the metal filled via array of a predetermined density in electrical communication with at least one underlying metallization layer the metal filled via array further including a predetermined density of interspersed electrically isolated dummy metal portions to form a via array monitor;

exposing the semiconductor process wafer including the via array monitor to an electrical charge altering process including to produce an electrically charged state over at least a portion of the via array monitor; and, carrying out electrical measurements of the via array monitor including at least one of resistance, impedance, and an electrical charge to determine an electrical charge level prior to carrying out a subsequent process.

17. The method of claim 16, further comprising carrying out a charge neutralizing process and repeating the step of electrical measurements until the electrical charge level is within a predetermined acceptable range.

18. The method of claim 16, wherein the via array monitor is provided in each of the active die on a semiconductor wafer.

19. The method of claim 16, wherein the dummy metal portions are interspersed periodically about equidistant from metal filled vias forming the via array.

20. The method of claim 16, wherein the electrical charge altering process is selected from the group consisting of a reactive ion etch (RIE) process, an ashing process, a plasma treatment process, and an electrostatic dechucking process.

21. The method of claim 16, wherein the metal for forming the metal filled vias and the electrically isolated dummy metal portions is selected from the group consisting of copper, aluminum, tungsten, and alloys thereof.

22. The method of claim 16, wherein the via array monitor is at least partially exposed in a level immediately underlying a metallization level following a plasma enhanced metal etching process.

23. The method of claim 22, wherein the level underlying a metallization level comprises tungsten plugs and the metallization level comprises AlCu metal interconnect lines.

24. The method of claim 16, wherein the subsequent process comprises a wet stripping process comprising hydroxyl ions.

* * * * *